United States Patent
Lai et al.

(10) Patent No.: US 7,985,482 B2
(45) Date of Patent: Jul. 26, 2011

(54) STIFFENER SHEET AND FLEXIBLE PRINTED CIRCUIT BOARD USING THE SAME

(75) Inventors: Yung-Wei Lai, Taoyuan (TW); Cheng-Wei Kuo, Taoyuan (TW); Shing-Tza Liou, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 607 days.

(21) Appl. No.: 12/144,260

(22) Filed: Jun. 23, 2008

(65) Prior Publication Data
US 2009/0205855 A1    Aug. 20, 2009

(30) Foreign Application Priority Data

Feb. 15, 2008    (TW) ................. 97105339 A

(51) Int. Cl.
*B32B 27/08*    (2006.01)
*B32B 27/34*    (2006.01)

(52) U.S. Cl. ........... 428/473.5; 428/209; 428/901
(58) Field of Classification Search ......... 428/209, 428/473.5, 901
See application file for complete search history.

(56) References Cited

U.S. PATENT DOCUMENTS
4,051,284 A * 9/1977 Ohkubo et al. ............. 428/36.9
* cited by examiner Primary Examiner — D. S Nakarani
(74) Attorney, Agent, or Firm — Andrew C. Cheng

(57) ABSTRACT

A stiffener sheet for flexible printed flexible printed circuit boards, includes alternately laminated polyimide layers and polyamideimide layers, wherein a molecular structure of the polyamideimide is represented by the following formula:

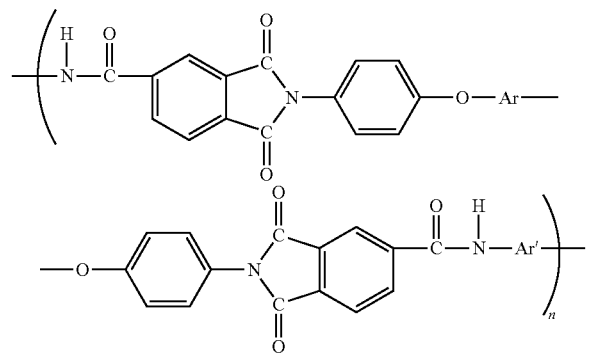

wherein Ar and Ar' represents different substituted aromatic groups.

7 Claims, 6 Drawing Sheets

STIFFENER SHEET AND FLEXIBLE PRINTED CIRCUIT BOARD USING THE SAME

CROSS-REFERENCE TO RELATED APPLICATIONS

This application is related to commonly-assigned co-pending applications (application Ser. No. 12/140,480) entitled, "STIFFENER AND STRENGTHENED FLEXIBLE PRINTED CIRCUIT BOARD HAVING THE SAME", filed on the 17 of Jun. 2008, and "STIFFENER AND STRENGTHENED FLEXIBLE PRINTED CIRCUIT BOARD HAVING THE SAME". Disclosures of the above identified applications are incorporated herein by reference.

BACKGROUND

1. Technical Field

The present invention generally relates to flexible printed circuit boards, and particularly, to a stiffener sheet and a stiffened flexible printed circuit board using the same.

2. Discussion of Related Art

With high demand of foldable electronic devices such as foldable mobile phones, flexible printed circuit boards (FPCBs) are widely employed for achieving electrical connection between movable part and main body. Generally, various kinds of electronic components (e.g. an integrated circuit) are mounted on FPCBs. However, strength of the FPCBs is not adequate for mounting such electronic components using the generally used surface mount technology (SMT).

In order to overcome above problem, referring to FIG. 1, a stiffener sheet 110 is attached to a surface of a flexible printed circuit board 130. An adhesive layer 120 is sandwiched between the stiffener sheet 110 and the flexible printed circuit board 130. In such circumstance, electronic components can be mounted on a portion of the flexible printed circuit board 130 corresponding to the stiffener sheet 110. However, if the stiffener sheet 110 and the flexible printed circuit board 130 have different thermal expansion coefficients, the stiffener sheet 110 and the flexible printed circuit board 130 may bend due to different thermal expansion, resulting in increase difficulty of mounting electronic components on bent flexible printed circuit boards 130.

What is needed, therefore, is a stiffener sheet has similar thermal expansion coefficient with flexible printed circuit boards, and a stiffened flexible printed circuit board including the same.

SUMMARY

In one embodiment, a stiffener sheet for flexible flexible printed circuit boards, comprising: alternately laminated polyimide layers and polyamideimide layers, wherein a molecular structure of the polyamideimide is represented by the following formula:

wherein Ar and Ar' represents different substituted aromatic groups.

This and other features and advantages of the present invention as well as the preferred embodiments thereof and a stiffener sheet and a stiffened flexible printed circuit board in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF EXEMPLARY EMBODIMENTS

Figure 1:
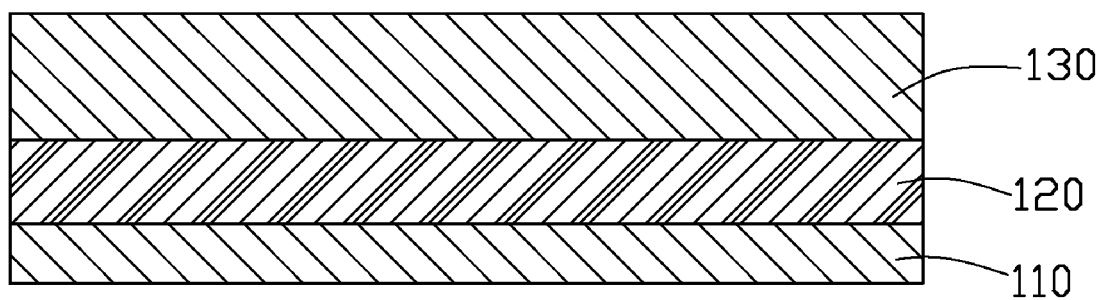
FIG. 1 is a schematic view of a generally used stiffened flexible printed circuit board.
Figure 2:
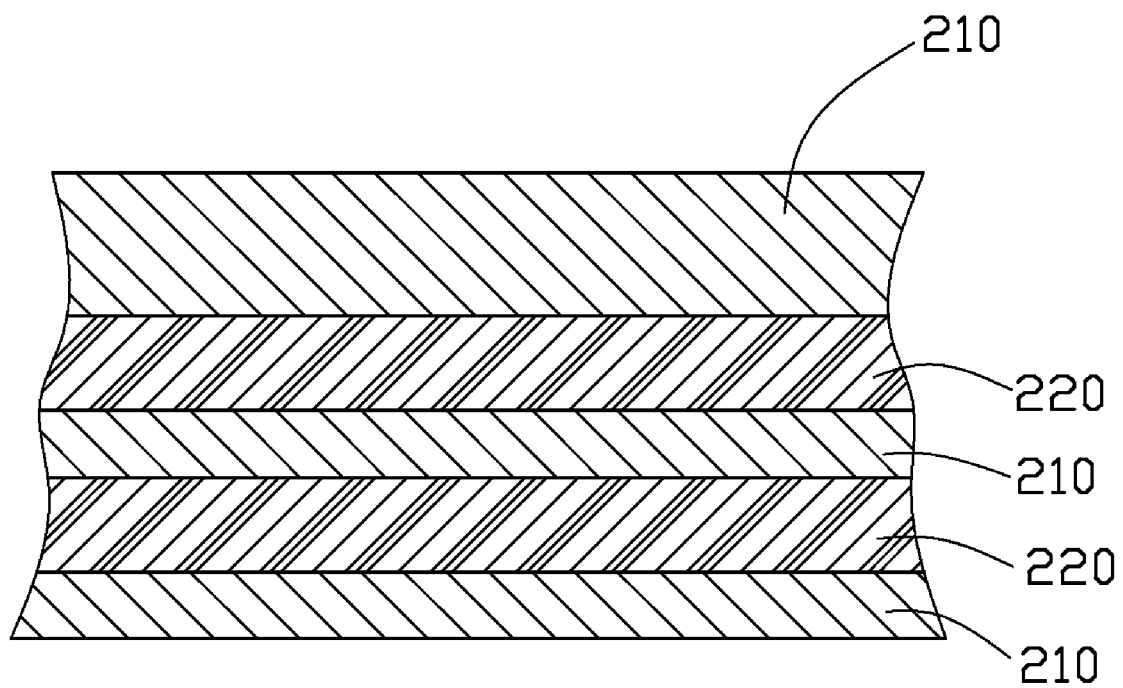
FIG. 2 is a partially enlarged cross sectional view of a stiffener sheet in accordance with a first embodiment.

As shown in FIG. 2, a stiffener sheet 20 for flexible printed circuit boards in accordance with a first embodiment includes alternately laminated polyimide (PI) layers 210 and polyamideimide (PAI) layers 220, is provided. Thickness of the PI layers and the PAI layers are both in a range from about 25 micrometers to about 75 micrometers. A thickness of the stiffener sheet 20 is in a range about 50 micrometers to about 250 micrometers. A molecular structure of the PAI is represented by the following formula:

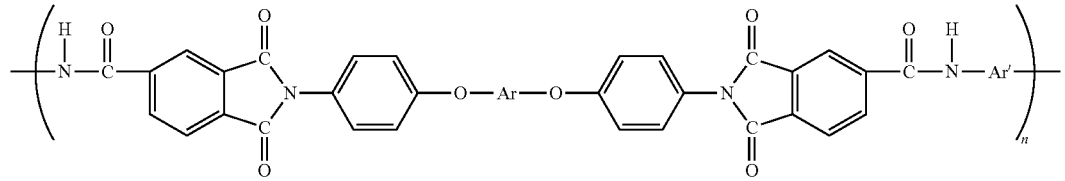

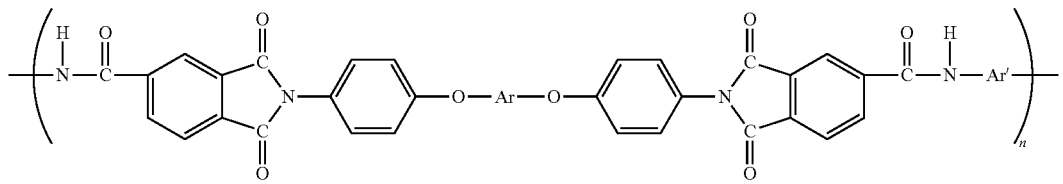

wherein Ar and Ar' represents different substituted aromatic groups. Examples of substitute group include alkyl group, halogen group, silicone group and ether group. Examples of Ar and Ar' include 4,4'-dimethylbiphenyl group, p-methyl phenyl group, and tetraphenylmethane group.

In synthesizing of PAI, firstly, a dimide diacid monomer is obtained from reaction of benzenetricarboxylic anhydride and a diamine compound (e.g. $NH_2$—$C_6H_5$—O—Ar—O—$C_6H_5$—$NH_2$); and secondly, PAI is obtained from polycondensation of the diamine monomer and another diamine monomer (e.g. $NH_2$—Ar'—$NH_2$).

In the present embodiment, the stiffener sheet 20 includes three PI layers 210 and two PAI layers 220. Each of the two PAI layers 220 is sandwiched between and contact with two adjacent PI layers 210.

Figure 3:
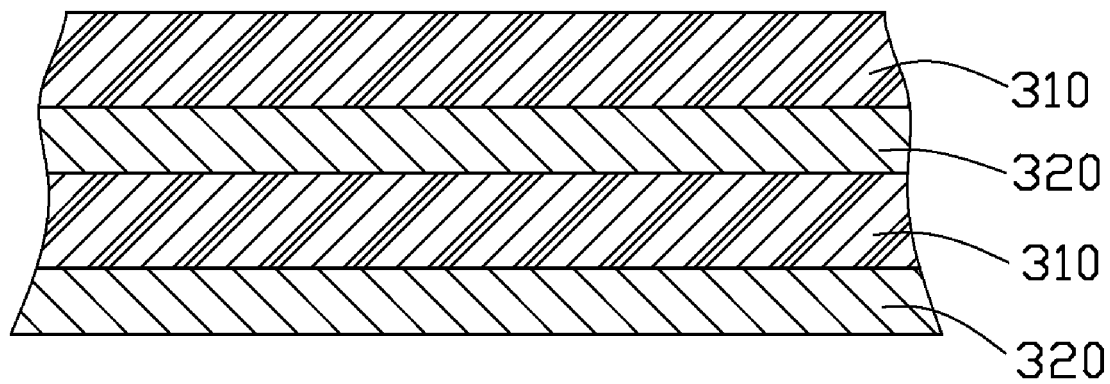
FIG. 3 is a partially enlarged cross sectional view of a stiffener sheet in accordance with a second embodiment.

Referring to FIG. 3, a stiffener sheet 30 in accordance with a second embodiment is similar to the stiffener sheet 20 of the first embodiment except that the stiffener sheet 30 includes two PI layers 310 and two PAI layers 320 arranged in alternate manner. In other words, two opposite surfaces of any one of the PI layers 310 are in contact with two PAI layers 320 respectively except the PI layer 310 is outmost layer of the stiffener sheet 30, and two opposite surfaces of any one of the PAI layers 320 are in contact with two PI layers 310 respectively except the PAI layer 320 is outmost layer of the stiffener sheet 30. In the present embodiment, the number of PI layers 310 is equal to the number of PAI layers 320. When attached to a flexible printed circuit board, the outmost layer of each of the PI layer 310 and the PAI layer 320 of the stiffener sheet 30 contacts with the flexible printed circuit board.

Figure 4:
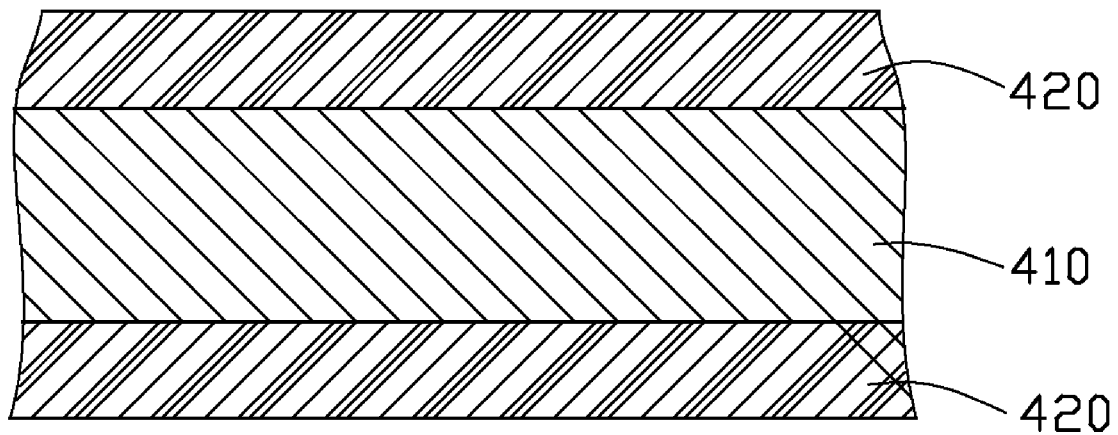
FIG. 4 is a partially enlarged cross sectional view of a stiffener sheet in accordance with a third embodiment.

Referring to FIG. 4, a stiffener sheet 40 in accordance with a third embodiment is similar to the stiffener sheet 20 of the first embodiment except that the stiffener sheet 40 includes one PI layer 410 and two PAI layers 420 arranged in alternative manner. In other words, two opposite surfaces of any one of the PI layers 410 are in contact with two PAI layers 420 respectively except the PI layer 410 is outmost layer of the stiffener sheet 40, and two opposite surfaces of any one of the PAI layers 420 are in contact with two PI layers 410 respectively except the PAI layer 420 is outmost layer of the stiffener sheet 40. The PI layer 410 is sandwiched between and contact with the two PAI layers 420. In the present embodiment, a thickness of the PI layer 410 is larger than that of the PAI layers 420. When attached to a flexible printed circuit board, one of the PAI layers 420 contacts with the flexible printed circuit board. It is understood that the number of the PI layers and PAI layers can vary according to need.

Similar to PI, molecular chain of PAI also contains imide groups. Thus, PAI has similar properties with PI, for example, excellent flexibility, heat-resistance, and chemical stability. Furthermore, a thermal expansion coefficient of PAI is about $22\times10^{-6}$~$33\times10^{-6}K^{-1}$, which approximately equals to that of PI. In other words, PI and PAI expand and contract in a same proportion when heated or cooled, thus the stiffener sheet 20 doesn't bend when heated or cooled. In addition, PAI has good fluidity at a melting state and can easily adhere to another object (i.e. a flexible printed circuit board).

Figure 5:
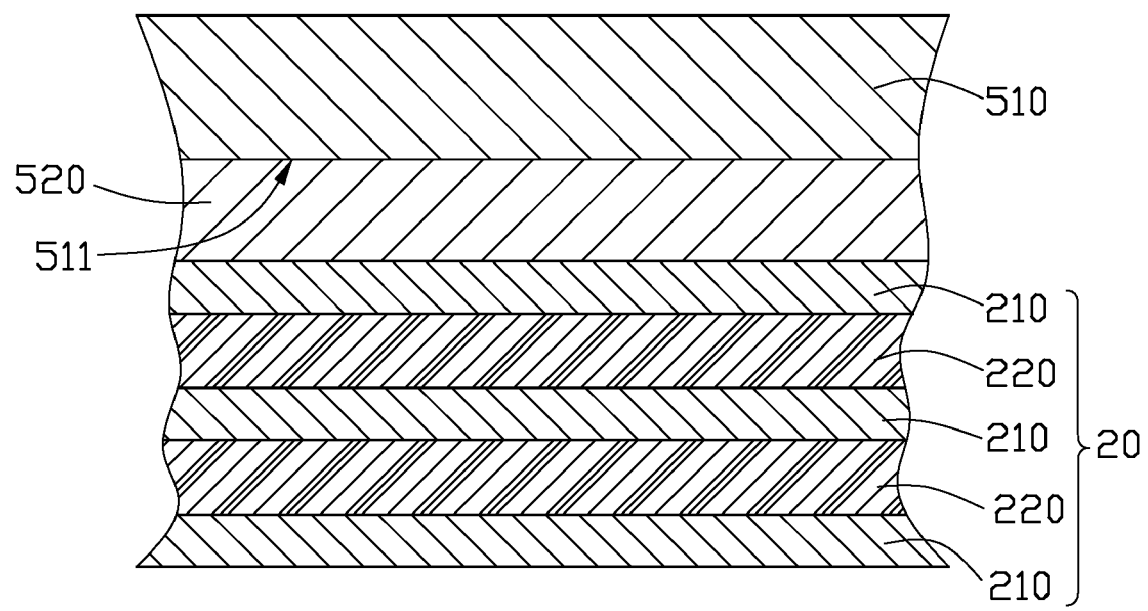
FIG. 5 is a partially enlarged cross sectional view of a stiffened flexible printed circuit board including the stiffener sheet of FIG. 2.

As shown in FIG. 5, a stiffened flexible printed circuit board 50 in accordance with a fourth embodiment includes a flexible printed circuit board 510 (i.e. a single-sided or double-sided flexible printed circuit board), the stiffener sheet 20 and an adhesive layer 520. The adhesive layer 520 is sandwiched between the stiffener sheet 20 and the flexible printed circuit board 510. The flexible printed circuit board 510 includes a contact surface 511, which is in contact with the adhesive layer 520. Two opposite surfaces of the adhesive layer 520 are respectively in contact with the stiffener sheet 20 and the flexible printed circuit board 510.

The adhesive layer 520 has a thickness of about 25 micrometers to about 70 micrometers. In the present embodiment, the adhesive layer 520 is a sheet of B-stage PAI. The molecular structure of the PAI can be represented by the following formula:

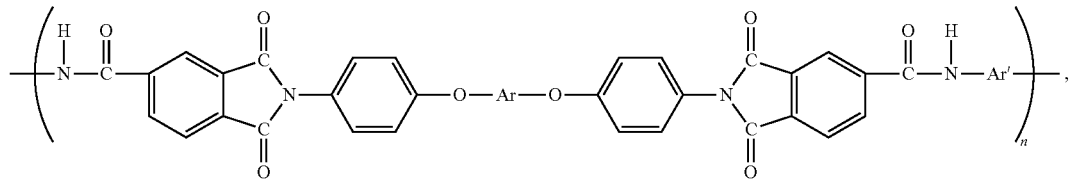

wherein Ar and Ar' represents different substituted aromatic groups. Examples of Ar and Ar' include 4,4'-dimethylbiphenyl group, p-methyl phenyl group, and tetraphenylmethane group.

As mentioned above, PAI has good fluidity at a melting state and can easily adhere to the flexible printed circuit board 510. In addition, PI and PAI expand and contract in a same proportion when heated or cooled, thus the stiffener sheet 20 and the flexible printed circuit board 510 don't bend when heated or cooled. It is to be understood that the stiffener sheet 20 can also be replaced with the stiffeners 30, and 40.

Figure 6:
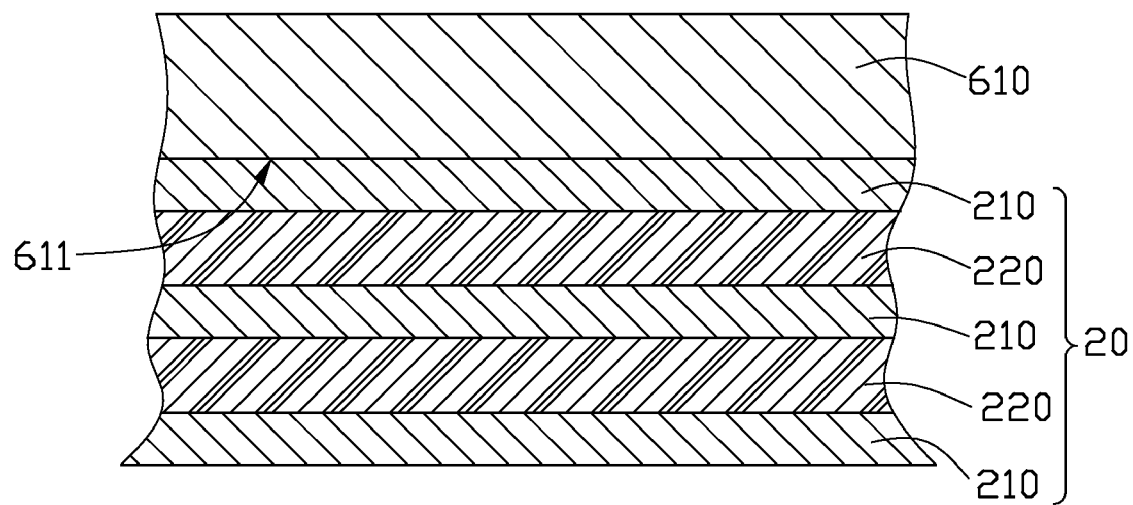
FIG. 6 is a partially enlarged cross sectional view of another stiffened flexible printed circuit board including the stiffener sheet of FIG. 2.

Referring to FIG. 6, a stiffened flexible printed circuit board 60 in accordance with a fifth embodiment is similar to the stiffened flexible printed circuit board 50 of the fourth embodiment except that the stiffener sheet 20 directly adheres to a flexible printed circuit board 610. There is no adhesive layer between the stiffener sheet 20 and the flexible printed circuit board 610. The flexible printed circuit board 610 includes a contact surface 611, which is in contact with one of the PI layers 210.

In the present embodiment, the PI layer 210 that is in contact with the flexible printed circuit board 610 also has good fluidity when heated and can serve as an adhesive layer facilitating adhering of stiffener to the flexible printed circuit board 610. It is to be understood that the stiffener sheet 20 can also be replaced with the stiffeners 30, and 40.

Generally, bonding force between PAI and flexible printed circuit board is larger than bonding force between PI and flexible printed circuit board; therefore, it is advantageously to employ PAI layer as outmost layer of above illustrated stiffener sheets 20, 30, and 40.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A stiffener sheet for a flexible printed circuit board, comprising: a plurality of polyimide layers and a plurality of polyamideimide layers, the polyimide layers and the polyamideimide layers alternately stacked one on another, wherein a molecular structure of the polyamideimide is represented by the following formula:

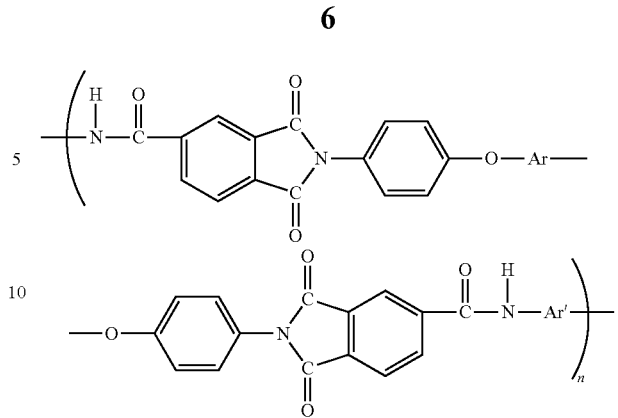

wherein Ar and Ar' represent different substituted aromatic groups.

2. The stiffener sheet as claimed in claim 1, wherein the number of the polyimide layers is equal to the number of the polyamideimide layers.

3. A stiffened flexible printed circuit board, comprising:
a flexible printed circuit board comprising a contact surface; and
a stiffener sheet attached on the contact surface, wherein the stiffener sheet comprising a plurality of polyimide layers and a plurality of polyamideimide layers, the polyimide layers and the polyamideimide layers alternately stacked one on another, wherein a molecular structure of the polyamideimide being represented by the following formula:

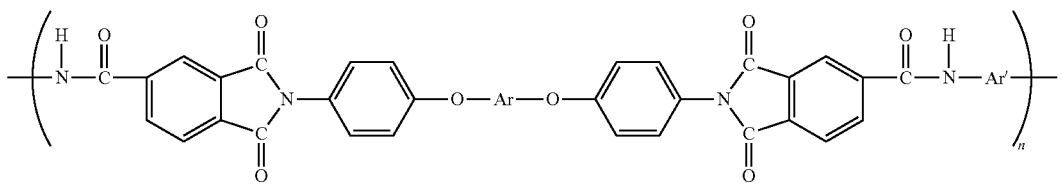

wherein Ar and Ar' represent different substituted aromatic groups.

4. The stiffened flexible printed circuit board as claimed in claim 3, wherein the number of the polyimide layers is equal to the number of the polyamideimide layers.

5. The stiffened flexible printed circuit board as claimed in claim 3, further comprising an adhesive layer sandwiched between the stiffener sheet and the flexible printed circuit board.

6. The stiffened flexible printed circuit board as claimed in claim 5, wherein the adhesive layer is comprised of polyamideimide.

7. A stiffened flexible printed circuit board, comprising:
a flexible printed circuit board; and
a stiffener sheet attached to the flexible printed circuit board, wherein the stiffener sheet comprising a plurality of polyimide layers and a plurality of polyamideimide layers, wherein a molecular structure of the polyamideimide being represented by the following formula:

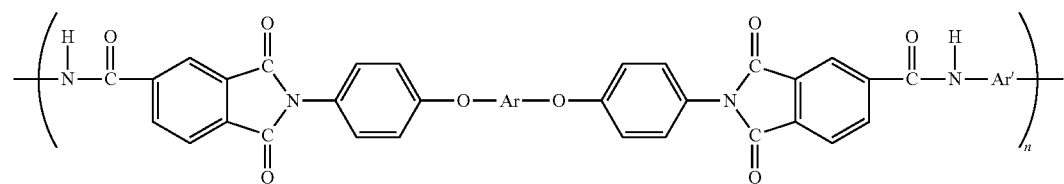
wherein Ar and Ar' represent different substituted aromatic groups.
* * * * *